United States Patent [19]

Lallement

[11] Patent Number: 4,819,709

[45] Date of Patent: Apr. 11, 1989

[54] HEAT SHIELD FOR A CASTING FURNACE

[75] Inventor: Bernard L. Lallement, Levallois-Perret, France

[73] Assignee: Societe Nationale d'Etude et de Construction de Moteurs d'Aviation (SNECMA), Paris, France

[21] Appl. No.: 182,414

[22] Filed: Apr. 18, 1988

[30] Foreign Application Priority Data

Apr. 23, 1987 [FR] France ............................... 87 05713

[51] Int. Cl.$^4$ ............................................. B22D 27/04
[52] U.S. Cl. .................. 164/154; 164/122.1; 164/338.1
[58] Field of Search ................. 164/338.1, 122, 122.1, 164/122.2, 124, 125, 126, 127, 361, 154

[56] References Cited

U.S. PATENT DOCUMENTS 3,942,581  3/1976  Sawyer .............................. 164/122.1
4,712,604  12/1987  Sawyer ........................ 164/338.1 X

FOREIGN PATENT DOCUMENTS 60-40664  3/1985  Japan .................................. 164/127

Primary Examiner—Nicholas P. Godici
Assistant Examiner—J. Reed Batten, Jr.
Attorney, Agent, or Firm—Bacon & Thomas

[57] ABSTRACT

A heat shield for a casting furnace consists of at least two elements slidably mounted in the furnace. The elements are generally planar in shape and extend between heating and cooling zones to provide the requisite heat insulation characteristics. The heat shield elements are movable in a direction generally parallel to their plane which extends generally perpendicularly to the path of movement of the mold from the heating zone into the cooling zone. Each of the heat shield elements consists of a generally planar, substantially rigid portion slidably mounted in the furnace and a generally planar second portion formed of a flexible refractory material. Distal edges of the second portions may overlap each other and may define an opening, the contour of which closely approximates that of the cross sectional contour of the mold.

6 Claims, 3 Drawing Sheets

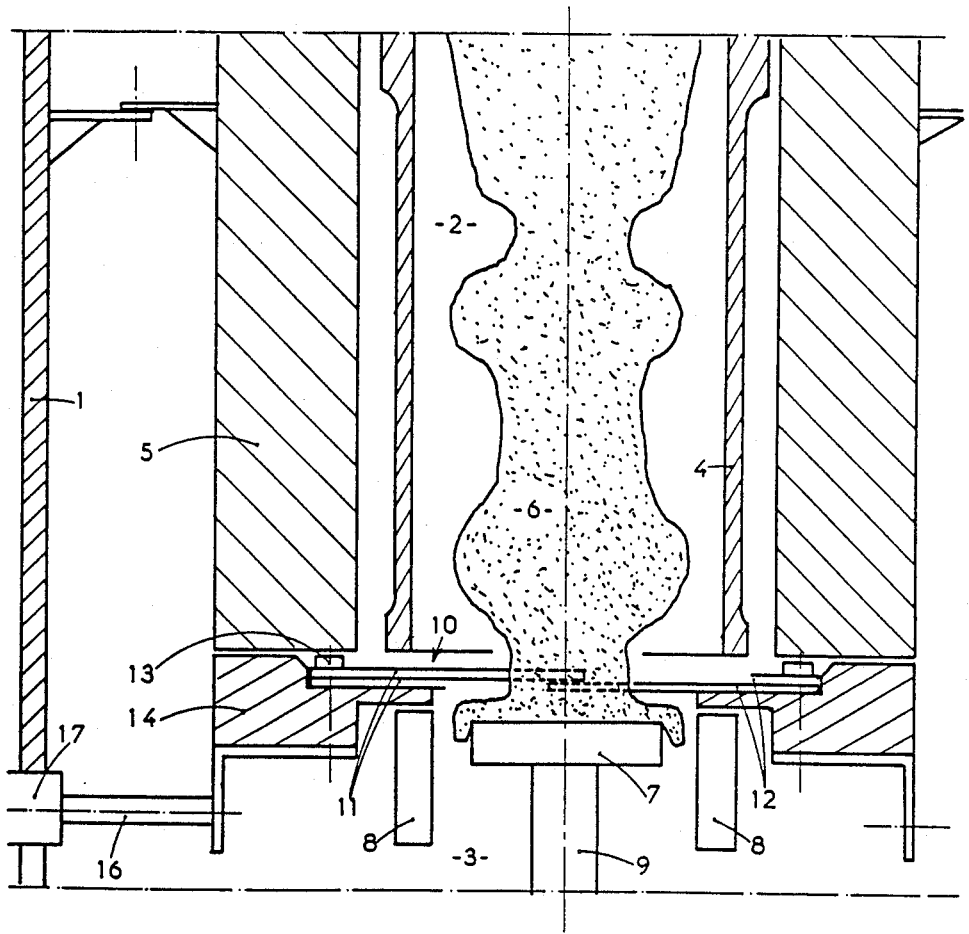
FIG:1

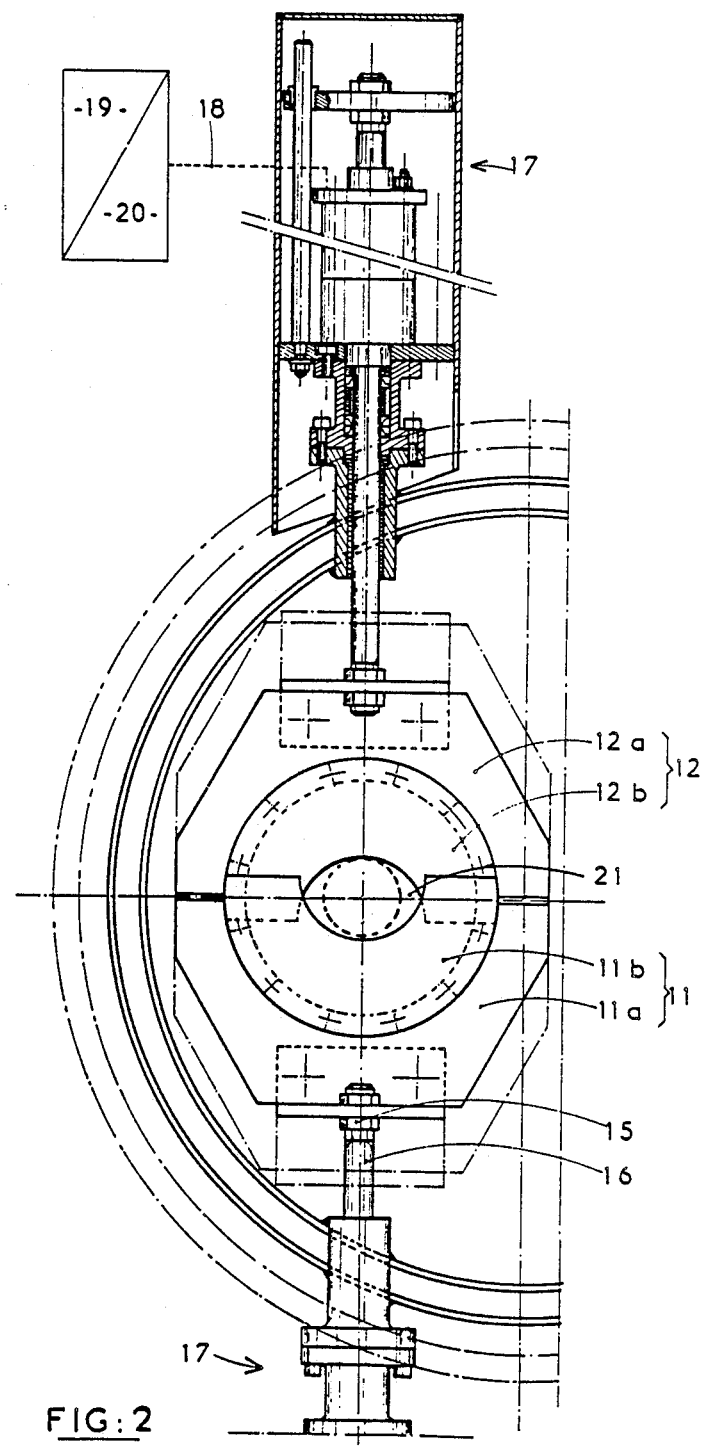
FIG: 2

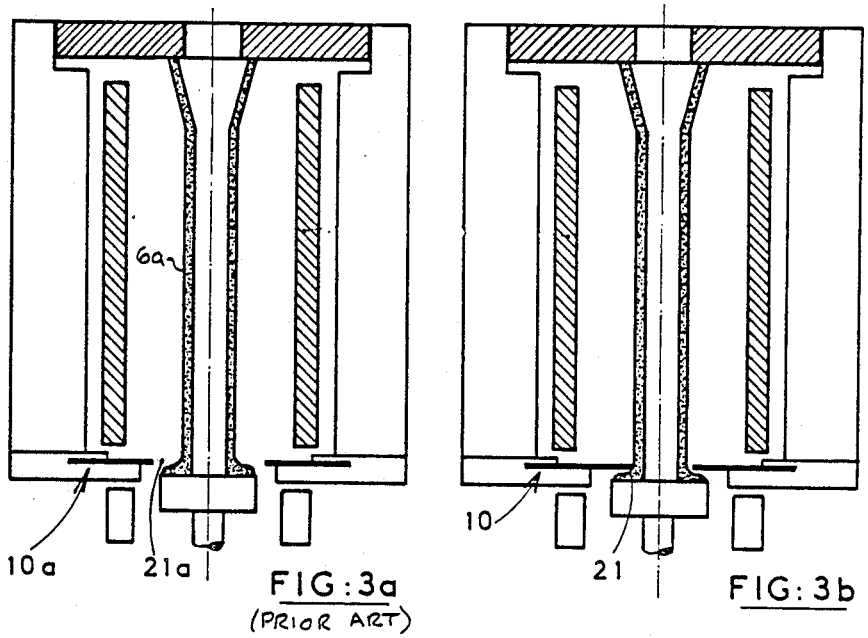
FIG:3a (PRIOR ART)
FIG:3b
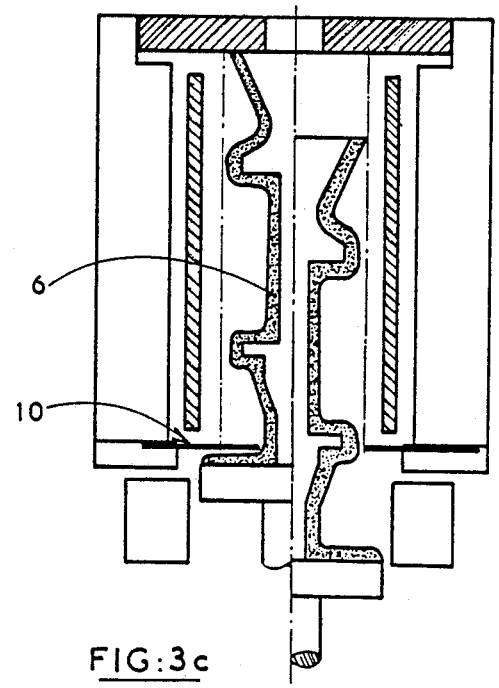
FIG:3c

HEAT SHIELD FOR A CASTING FURNACE

BACKGROUND OF THE INVENTION

The present invention relates to a heat shield for a casting furnace, such as a furnace for casting superalloy parts having oriented structures. The heat shield is disposed between a heating zone of the furnace and a cooling zone in which the molten metal is solidified.

It is known to utilize furnaces for casting metal wherein a mold is placed within the furnace and molten metal is poured into the mold. After a specified heating time at specific temperatures, the mold is then moved from the heating zone of the furnace into a zone wherein the metal within the mold is cooled and solidified. The precise heating temperatures in conjunction with heating rates and cooling rates enable the casting of a metal, such as a superalloy, having a specific oriented metallic structure.

French Pat. No. A 2,604,378 describes a heat shield in conjunction with such a furnace wherein the heat shield is mounted between the heating and cooling zones of the furnace to prevent the heat exchange therebetween. The heat shield in this invention performs the heat insulation function, but at the same time allows the mold to pass between the heating zone and the cooling zone.

U.S. Pat. No. 3,714,977 to Terkelsen illustrates a casting furnace having a heat shield wherein a mold is moved between a heating zone and a cooling zone. The heat shield in Terkelsen is attached to the mold mounting device such that it surrounds the mold. As the mold moves downwardly, the heat shield bears against a stationary structure and stops while the movement of the mold continues into the cooling zone.

The known devices do not provide adequate heat insulation between the heating and cooling zones in those instances wherein the geometry of mold is complex. Consequently, drops in the thermal gradient take place which causes variations, particular increases, in the sizes of the primary dendrites of the cast parts. Such increased size dendrites substantially degrade the mechanical properties of the cast parts and require a more complex subsequent heat treatment.

SUMMARY OF THE INVENTION

The present invention overcomes the difficulties of the prior art and avoids the drawbacks of the known devices. The heat shield according to the present invention consists of at least two elements slidably mounted in the furnace. The elements are generally planar and extend laterally between the heating and cooling zones to provide the requisite heat insulation characteristics. The heat shield elements are movable in a direction generally parallel to their plane which extends generally perpendicularly to the path of movement of the mold from the heating zone into the cooling zone.

Each of the heat shield elements comprises a generally planar, substantially rigid portion slidably mounted in the furnace and a generally planar second portion attached thereto wherein the second portion is formed of a flexible refractory material.

Distal edges of the second portions may overlap each other and may define an opening, the contour of which closely approximates that of the cross-sectional contour of the mold.

Actuators are attached to the rigid portions of the heat shield and serve to move the heat shield elements perpendicularly to the path of travel as the mold moves from the heating zone into the cooling zone.

BRIEF DESCRIPTION OF THE DRAWINGS

FIG. 1 is a partial, schematic cross-sectional view of a furnace incorporating the heat shield according to the invention.

FIG. 2 is a partial, cross-sectional view of the furnace of FIG. 1 showing the heat shield according to the invention and its actuating mechanism.

FIG. 3a is a schematic diagram of a furnace incorporating a heat shield according to the prior art.

FIGS. 3b and 3c are schematic diagrams showing a furnace incorporating the heat shield according to the invention.

DETAILED DESCRIPTION OF THE PREFERRED EMBODIMENT

A furnace for casting metal parts, particularly superalloys having an oriented structure, is shown in an axial cross-section in FIG. 1 and comprises outer furnace wall 1, an upper part of which constitute the heating chamber 2 and a lower part defines the solidification or cooling chamber 3. The heating chamber 2 contains known heaters 4, which may be of the electrically resistive type. Thermal insulators 5 are disposed between the outer wall 1 and the heaters 4 in known fashion.

Mold 6 is illustrated in FIG. 1 as resting on a horizontal hearth 7 which, in known fashion, defines cooling passages therein (not shown). Hearth 7 is mounted on a movable support 9 which allows the mold to be lowered from the heating chamber 2 into the cooling chamber 3 adjacent to cooling elements 8.

The heat shield 10 according to the invention is located between the heating chamber 2 and the cooling chamber 3, and provides heat insulation between the heaters 4 and the cooling elements 7 and 8. As illustrated in FIG. 2, the outer contour of the shield 10 is polygonal, but other shapes, such as circular, may be utilized without exceeding the scope of this invention. The heat shield 10 comprises a pair of heat shield elements 11 and 12 located on either side of the axis of the path of movement of the support 9 and the mold 6. The heat shield elements define an aperture 21 having a contour similar to that of the cross-section of the mold to accommodate the passage of the mold through the heat shield. Each heat shield element 11 and 12 is attached to a support 14 via bolts 13 or the like.

Each of the heat shield elements 11 and 12 comprise a generally planar, substantially rigid first portion 11a and 12a located furtherest from the mold 6. The first portions 11a and 12a are made of a rigid, known refractory material. Generally planar, second portions 11b and 12b are attached to each of the first portions 11a and 12a, respectively. The second portions 11b and 12b are fabricated from a flexible refractory or other known flexible thermally insulating material. The distal edges of the second portions 11b and 12b define the aperture 21 and may also have portions which overlap each other, as illustrated in FIG. 2.

Also illustrated in FIG. 2 are the driving means 17 for moving the heat shield elements 11 and 12 in a direction generally parallel to their plane and generally perpendicular to the path of travel of the mold 6 as it moves from the heating chamber 2 into the cooling chamber 3. The end 15 of control rod 16, extending from actuator 17, is attached to each support element 14 such that movement of the control rod 16 along its axis serves to move the heat shield elements toward or away from each other and the path of travel of the mold 6. In this manner, the contour of the aperture 21 defined by the heat shield elements 11b and 12b can accurately match the outer contour of the mold 6 as it passes through the heat shield.

Each of the actuators 17 may be driven by a control link 18 connected to the furnace control 19. In particular, the control link 18 may be interconnected with the control 20 which actuates the movement of the support 9 so as to move the mold 6. Thus, during the solidification of the part as it moves from the heating chamber 2 into the cooling chamber 3, the movement of the heat shield elements is controlled by the means controlling the movement of the support 9, which thereby enables the heat shield 10 to be as closely fitted as possible to the outer contour of the mold as it passes through the heat shield.

FIG. 3a schematically illustrates a furnace having a heat shield 10a which is fixedly attached to the furnace according to the known prior art. Since the heat shield 10a is fixed, the central aperture 21a must at least be equal to the maximum cross-section of the mold 6a. In a furnace of this type, a primary dendrite size range from 280 u at 40 mm from the base of the mold to 350 u at its top was observed.

FIG. 3b is a schematic view of a furnace similar to that of FIG. 3a, however, a heat shield 10 according to the invention is shown. Since each of the heat shield elements is movable with respect to the path of travel of the mold, the central apertures 21 can be adjusted to match the corresponding cross-section of the mold 6 at any point along the length of the mold. Utilizing a furnace incorporating this heat shield, the part had a primary dendrite size of 230 u. This value is less than that observed in the furnace of FIG. 3a and is constant over the entire length of the mold.

FIG. 3c is a schematic diagram similar to that of FIG. 3b showing a furnace incorporating the heat shield according to the invention. This figure illustrates that molds of complex cross-sectional shape may be accommodated by the heat shield according to the invention, while at the same time, providing the requisite heat insulation between the heating and cooling zones.

The heat shield according to the invention has overcome the problems associated with the oriented solidification of the cast parts, especially from superalloy metals, in particular regarding the monocrystalline solidification.

The foregoing description is provided for illustrative purposes only and should not be construed as in any way limiting this invention, the scope of which is defined solely by the appended claims.

I claim:

1. In a furnace for casting metal, in particular superalloy cast parts having oriented structures, having a heating zone accommodating a mold for heating metal in a mold, a cooling zone for solidifying the metal in the mold and means to move the mold between the heating and cooling zones along a path of travel, the improvement comprising:
    (a) a heat shield separating the heating and cooling zones having at least two laterally disposed heat shield elements; and
    (b) actuating means to move the elements of the heat shield generally perpendicularly to the path of travel of the mold.

2. The furnace according to claim 1 wherein each heat shield element comprises:
    (a) a generally planar, substantially rigid first portion slidably mounted in the furnace; and,
    (b) a generally planar second portion attached to the first portion, the second portion formed of a flexible refractory material.

3. The furnace according to claim 2 wherein adjacent distal edges of the second portions define a contour closely approximating the cross-sectional contour of the mold.

4. The furnace according to claim 2 wherein adjacent distal edges of the second portions at least partially overlap.

5. The furnace according to claim 2 wherein the actuating means comprises:
    (a) at least two actuators, each actuator having a movable control rod; and,
    (b) means connecting each control rod to the first portion of each heat shield element.

6. The furnace according to claim 5 wherein the furnace has control means to control the temperature of the heating zone and the movement of the mold between the heating and cooling zones and further comprising means interconnecting the furnace control means and the actuators such that the second portions of the heat shield elements are maintained in close proximity to the contour of the mold as the mold passes from the heating zone into the cooling zone.

* * * * *